United States Patent
Yang et al.

(10) Patent No.: US 9,099,629 B2
(45) Date of Patent: Aug. 4, 2015

(54) SEMICONDUCTOR LIGHT EMITTING DEVICE AND LIGHT EMITTING APPARATUS

(71) Applicant: SAMSUNG ELECTRONICS CO., LTD., Suwon-si, Gyeonggi-do (KR)

(72) Inventors: Jong In Yang, Gyeonggi-do (KR); Yong Il Kim, Gyeonggi-do (KR); Kwang Min Song, Gyeonggi-do (KR); Wan Tae Lim, Gyeonggi-do (KR); Se Jun Han, Gyeonggi-do (KR); Hyun Kwon Hong, Chungcheongnam-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 21 days.

(21) Appl. No.: 13/929,431

(22) Filed: Jun. 27, 2013

(65) Prior Publication Data

US 2014/0048838 A1 Feb. 20, 2014

(30) Foreign Application Priority Data

Aug. 14, 2012 (KR) .................. 10-2012-0089024

(51) Int. Cl.
| H01L 27/15 | (2006.01) |
| H01L 29/267 | (2006.01) |
| H01L 31/12 | (2006.01) |
| H01L 33/00 | (2010.01) |
| H01L 33/62 | (2010.01) |
| H01L 33/20 | (2010.01) |
| H01L 33/38 | (2010.01) |
| H01L 33/44 | (2010.01) |

(52) U.S. Cl.
CPC .............. *H01L 33/62* (2013.01); *H01L 33/382* (2013.01); *H01L 33/20* (2013.01); *H01L 33/38* (2013.01); *H01L 33/44* (2013.01); *H01L 2224/16* (2013.01); *H01L 2933/0016* (2013.01)

(58) Field of Classification Search
None
See application file for complete search history.

(56) References Cited

U.S. PATENT DOCUMENTS 6,514,782 B1 * 2/2003 Wierer, Jr. et al. .............. 438/22
8,168,996 B2    5/2012 Inoue et al.
(Continued)

FOREIGN PATENT DOCUMENTS

JP   2011-233808 A    11/2011
KR   10-0512361 B1    9/2005
(Continued)

*Primary Examiner* — Sonya D McCall Shepard
(74) *Attorney, Agent, or Firm* — McDermott Will & Emery LLP

(57) ABSTRACT

A semiconductor light emitting device includes a first conductive semiconductor layer, an active layer, a second conductive semiconductor layer, a first internal electrode, a second internal electrode, an insulating part, and first and second pad electrodes. The active layer is disposed on a first portion of the first conductive semiconductor layer, and has the second conductive layer disposed thereon. The first internal electrode is disposed on a second portion of the first conductive semiconductor layer separate from the first portion. The second internal electrode is disposed on the second conductive semiconductor layer. The insulating part is disposed between the first and second internal electrodes, and the first and second pad electrodes are disposed on the insulating part to connect to a respective one of the first and second internal electrodes.

10 Claims, 13 Drawing Sheets

(56) References Cited

U.S. PATENT DOCUMENTS

| | | | |
|---|---|---|---|
| 8,258,519 B2 * | 9/2012 | Hsu | 257/79 |
| 2003/0230754 A1 * | 12/2003 | Steigerwald et al. | 257/91 |
| 2011/0233603 A1 | 9/2011 | Kim et al. | |
| 2012/0049234 A1 | 3/2012 | Cheng | |
| 2012/0049238 A1 | 3/2012 | Tanaka et al. | |

FOREIGN PATENT DOCUMENTS

| | | |
|---|---|---|
| KR | 10-0732921 B1 | 6/2007 |
| KR | 2011-0069374 A | 6/2011 |
| KR | 10-2012-0014284 A | 2/2012 |
| KR | 10-2012-0053571 A | 5/2012 |

\* cited by examiner

A-A'

SEMICONDUCTOR LIGHT EMITTING DEVICE AND LIGHT EMITTING APPARATUS

CROSS-REFERENCE TO RELATED APPLICATIONS

This application claims the priority of Korean Patent Application No. 10-2012-0089024 filed on Aug. 14, 2012, in the Korean Intellectual Property Office, the disclosure of which is incorporated herein by reference.

TECHNICAL FIELD

The present disclosure relates to a semiconductor light emitting device and a light emitting apparatus.

BACKGROUND

A light emitting diode (LED) is a semiconductor light emitting device able to emit light of various colors due to the recombination of electrons and electron holes at a junction between p-type and n-type semiconductor layers when current is applied thereto. Such a semiconductor light emitting device is advantageous over a filament-based light emitting device in that it has a relatively longer lifespan, lower power consumption, superior initial-operation characteristics, and the like, in comparison thereto. These factors have continually boosted demand for semiconductor light emitting devices. Notably of late, a great deal of attention has been drawn to group III nitride semiconductors that can emit light within a blue short light wavelength region.

Since the development of LEDs using nitride semiconductors, technical advances have broadened the range of applications thereof. Thus, many studies are being conducted to determine how to utilize nitride semiconductor devices in general lighting apparatuses and electrical lighting sources. Nitride light emitting devices have been used as components employed in low-current, low output mobile products. The range of applications of nitride light emitting devices has further broadened to encompass the field of high-current, high-output products.

Accordingly, research into improvements in light emitting efficiency and semiconductor light emitting device quality has been undertaken, and in particular, light emitting devices having various electrode structures have been developed in order to improve light output rates and reliability thereof.

SUMMARY

According to one aspect of the present application, a semiconductor light emitting device provides improved current distribution efficiency and a significantly reduced occurrence of delamination defects between an electrode and a semiconductor layer.

An aspect of the present disclosure also provides a semiconductor light emitting device having a reduced operating voltage and improved light output.

Other aspects of the present disclosure also provide a method of manufacturing a semiconductor light emitting device and a light emitting apparatus having enhanced heat radiation efficiency and reliability.

The objects of the present disclosure are not limited thereto, and even if they are not explicitly mentioned, objects and effects derived from embodiments and claims of the present application are included within the scope of the disclosure.

According to an aspect of the present disclosure, a semiconductor light emitting device includes: a first conductive semiconductor layer; an active layer disposed on a first portion of the first conductive semiconductor layer; a second conductive semiconductor layer disposed on the active layer; a first internal electrode disposed on a second portion of the first conductive semiconductor layer separate from the first portion; a second internal electrode disposed on at least one portion of the second conductive semiconductor layer and connected to the second conductive semiconductor layer; an insulating part disposed on one portion of the second portion, the first and second internal electrodes respectively and having an open region to expose at least one portion of each of the first and second internal electrodes; and first and second pad electrodes disposed on the insulating part and each connected to a respective one of the first and second internal electrodes exposed through the open region.

The first internal electrode may be formed of a plurality of electrodes separate from each other and disposed on the second portion of the first conductive semiconductor layer, and the first pad electrode may interconnect the electrodes of the plurality of electrodes forming the first internal electrode. The insulating part may expose at least a portion of each of the plurality of electrodes forming the first internal electrode.

The first internal electrode may include a plurality of first regions and a plurality of second regions connecting the plurality of first regions, and each of the first regions may have a width that is larger than a width of each of the second regions.

The plurality of first regions may be arranged in a plurality of rows and a plurality of columns, and each of the second regions may connect first regions that are arranged in a same row.

The first internal electrode may include a third region connecting first regions in different rows among the plurality of rows. The first internal electrode may be formed to a same thickness in the first regions and in the second regions thereof. The insulating part may not cover an upper surface of the first internal electrode. The first internal electrode and the first pad electrode may be formed of the same material.

According to another aspect of the present disclosure, a method of manufacturing a semiconductor light emitting device includes forming a groove in a first conductive semiconductor layer, an active layer formed on the first conductive semiconductor layer, and a second conductive semiconductor layer formed on the active layer, by removing at least one portion of the second conductive semiconductor layer and the active layer so as to expose a first portion of the first conductive semiconductor layer. A first internal electrode connected to the first portion of the first conductive semiconductor layer is formed by filling a portion of the groove with an electrode material. A second internal electrode connected to the second conductive semiconductor layer is formed on at least one portion of the second conductive semiconductor layer. An insulating part is formed by filling a remainder portion of the groove with an insulating material, wherein the insulating part is formed on one portion of the second portion, the first and second internal electrodes respectively and formed to have an open region exposing at least one portion of each of the first and second internal electrodes. First and second pad electrodes are then formed on the insulating part and are each connected to a respective one of the first and second internal electrodes exposed through the open region.

In accordance with the method, the first internal electrode may be formed to have a shape corresponding to a shape of the groove. The groove may be formed to include a plurality of first regions separate from each other and a plurality of second regions connecting the plurality of first regions, and each of the first regions may have a width that is larger than a width of each of the second regions.

The plurality of first regions may be arranged in a plurality of rows and a plurality of columns, and each of the second regions may connect first regions that area arranged in a same row.

The groove may include a third region connecting first regions that area arranged in different rows among the plurality of rows.

The first internal electrode may be formed to fill a portion of the third region.

The first internal electrode may be formed to fill a portion of the first regions and a portion of the second regions.

The first internal electrode may be formed such that portions filling the first and second regions may have the same thickness.

The first internal electrode may be formed to fill a portion of the first regions and may not be formed in the second regions.

The first internal electrode may be formed to include a plurality of contact regions each filling a portion of a corresponding first region, and the insulating part may be formed to expose at least one portion of each of the plurality of contact regions and to cover the second regions such that the second regions are not exposed.

The groove may be formed to have a shape in which a plurality of stripes are arranged in parallel to each other, when viewed from above the second conductive semiconductor layer, and the plurality of stripes may be connected to each other through another region of the groove formed in a direction perpendicular to the plurality of stripes.

The plurality of stripes may have a uniform width.

The insulating part may not cover an upper surface of the first internal electrode The first internal electrode and the first pad electrode may be formed of the same material.

According to another aspect of the present disclosure, a light emitting apparatus, includes: a mounting substrate; and a semiconductor light emitting device disposed on the mounting substrate and configured to emit light when an electrical signal is applied thereto, wherein the semiconductor light emitting device includes: a first conductive semiconductor layer; an active layer disposed on a first portion of the first conductive semiconductor layer; a second conductive semiconductor layer disposed on the active layer; a first internal electrode disposed on a second portion of the first conductive semiconductor layer separate from the first portion; a second internal electrode disposed on at least one portion of the second conductive semiconductor layer; an insulating part disposed on one portion of the second portion, the first and second internal electrodes respectively and having an open region to expose at least one portion of each of the first and second internal electrodes; and first and second pad electrodes disposed on the insulating part and each connected to a respective one of the first and second internal electrodes exposed through the open region.

BRIEF DESCRIPTION OF THE DRAWINGS

The above and other aspects, features, and other advantages of the present disclosure will be more clearly understood from the following detailed description taken in conjunction with the accompanying drawings, in which.

DETAILED DESCRIPTION OF THE EMBODIMENTS

Figure 1:
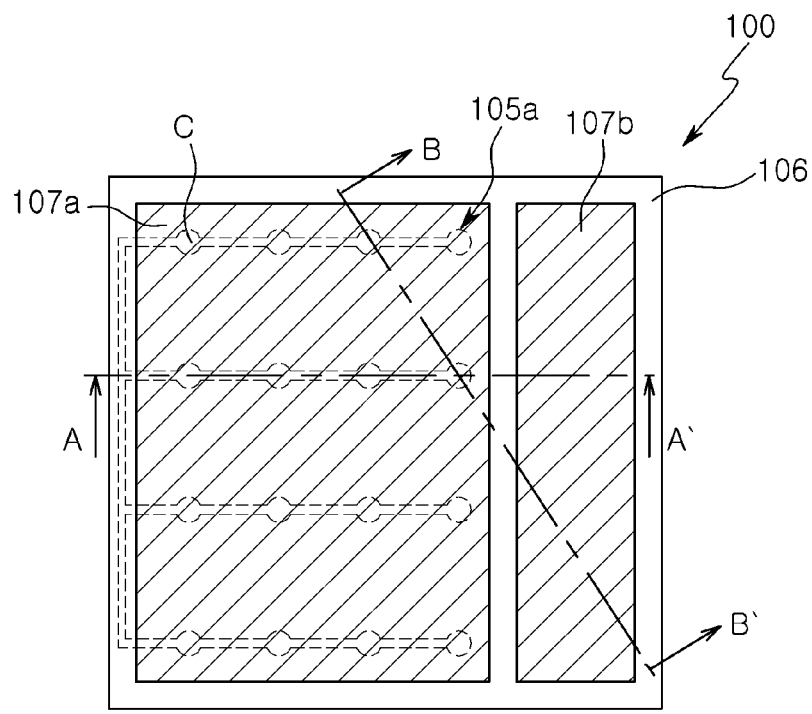
FIG. 1 is a schematic planar view illustrating a semiconductor light emitting device according to an embodiment of the present disclosure.

Hereinafter, embodiments of the present disclosure are described in detail with reference to the accompanying drawings. The inventive concepts may, however, be embodied in many different forms and should not be construed as being limited to the embodiments set forth herein. Rather, these embodiments are provided so that this disclosure will be thorough and complete, and will fully convey the scope of the inventive concepts. In the drawings, the shapes and dimensions of elements may be exaggerated for clarity, and the same reference numerals will generally be used throughout to designate the same or like elements.

Figure 2:
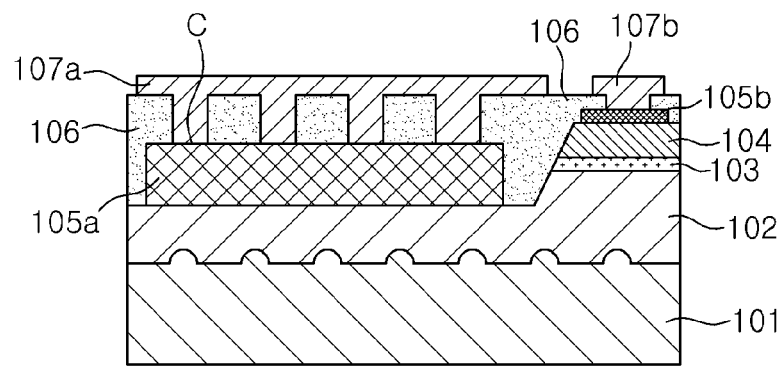
FIG. 2 is a schematic cross-sectional view illustrating a semiconductor light emitting device according to an embodiment of the present disclosure, taken along line A-A' of FIG. 1.
Figure 3:
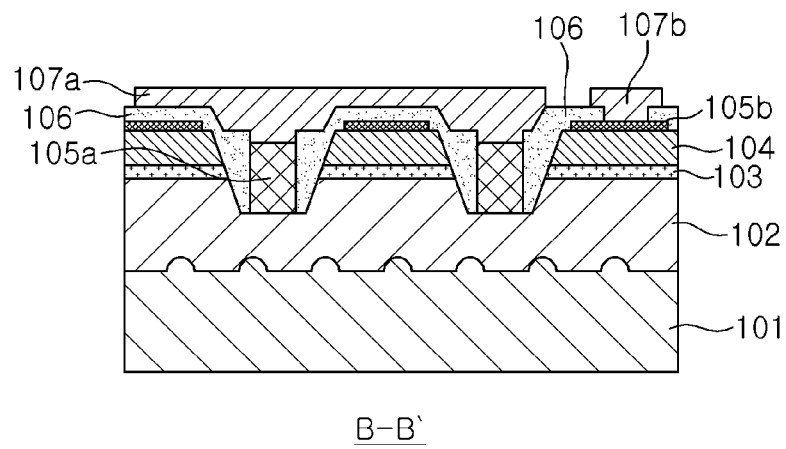
FIG. 3 is a schematic cross-sectional view illustrating a semiconductor light emitting device according to an embodiment of the present disclosure, taken along line B-B' of FIG. 1.

FIG. 1 is a schematic planar view illustrating a semiconductor light emitting device according to an embodiment of the present disclosure; FIG. 2 is a schematic cross-sectional view, taken along line A-A' of FIG. 1; and FIG. 3 is a schematic cross-sectional view, taken along line B-B' of FIG. 1. Referring to FIGS. 1, 2, and 3, a semiconductor light emitting device 100 may include a light emitting structure disposed on a substrate 101, that is, a light emitting stack including a first conductive semiconductor layer 102, an active layer 103, and a second conductive semiconductor layer 104, and an electrode structure including first and second internal electrodes 105a and 105b and first and second pad electrodes 107a and 107b. Hereinafter, respective components of the semiconductor light emitting device 100 will be described.

The substrate 101 may be provided as a semiconductor growth substrate and be formed of a semiconductor material having insulation or conductivity properties, such as sapphire, silicon carbide (SiC), $MgAl_2O_4$, MgO, $LiAlO_2$, $LiGaO_2$, GaN, or the like. The substrate 101 may have characteristics allowing at least a portion of light emitted from the active layer 103 to be transmitted therethrough. Accordingly, the semiconductor light emitting device 100 may have flip-chip form, in which when the semiconductor device is mounted in a circuit, the substrate 101 is upwardly directed. In this case, sapphire having electrical insulation properties may most preferably be used as the substrate 101. Sapphire is a crystal having Hexa-Rhombo R3C symmetry and has a lattice constant of 13.001 Å along a C-axis and a lattice constant of 4.758 Å along an A-axis. The sapphire includes a C (0001) plane, an A (1120) plane, an R (1102) plane, and the like. In this case, the C plane is mainly used as a nitride growth substrate because the C plane relatively facilitates the growth of a nitride film and is stable at high temperature. Meanwhile, as illustrated in FIG. 2 and FIG. 3, a plurality of uneven structures may be formed on an upper surface of the substrate 101, namely, a semiconductor growth surface, such that the structures increase semiconductor layer crystallinity and light emission efficiency. However, uneven structures are not necessarily required, and in some cases, they may be excluded.

The first and second conductive semiconductor layers 102 and 104 of the light emitting structure may be semiconductors doped with n-type and p-type impurities, respectively; however, the present disclosure is not limited thereto. More generally, the first and second conductive semiconductor layers 102 and 104 may be p-type and n-type semiconductor layers, respectively. The first and second conductive semiconductor layers 102 and 104 may be formed of a nitride semiconductor, for example, a material having a compositional formula of $Al_xIn_yGa_{1-x-y}N$ ($0 \leq x \leq 1$, $0 \leq y \leq 1$, $0 \leq x+y \leq 1$). Besides, an AlGaInP-based semiconductor or an AlGaAs-based semiconductor may also be used. In addition, the active layer 103, disposed between the first and second conductive semiconductor layers 102 and 104, may have a multi-quantum well (MQW) structure in which quantum well layers and quantum barrier layers are alternately stacked, and here, in the case of a nitride semiconductor, a GaN/InGaN structure may be used, for example. Meanwhile, the first and second conductive semiconductor layers 102 and 104 and the active layer 103 forming the light emitting structure may be grown by a process known in the art, such as metal organic chemical vapor deposition (MOCVD), hydride vapor phase epitaxy (HYPE), molecular beam epitaxy (MBE), or the like.

Figure 6:
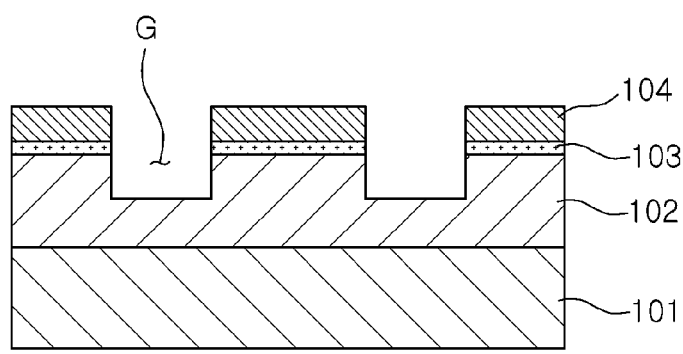

The first internal electrode 105a may be formed on a substrate 101 on which the first conductive semiconductor layer 102, the active layer 103, and the second conductive semiconductor layer 104 have been sequentially formed. The first internal electrode 105a can then be formed by removing the first conductive semiconductor layer 102, the active layer 103, and the second conductive semiconductor layer 104 from a portion of the substrate so as to form a groove that reaches and connects to the first conductive semiconductor layer 102. The first internal electrode 105a can then be formed in the groove on the exposed portion of the substrate and may have a shape corresponding to that of the groove. In addition, the second internal electrode 105b may be formed on at least one portion of the second conductive semiconductor layer 104 other than the portion having the first internal electrode 105a formed thereon, and the second internal electrode 105b may be formed to be connected to the second conductive semiconductor layer 104. Alternatively, the first conductive semiconductor layer 102 may not be removed so as to form the groove exposing the first conductive semiconductor layer 102. In such a case, the first internal electrode 105a may contact an uppermost surface of the first conductive semiconductor layer 102. Meanwhile, when the groove is formed by removing a portion of the light emitting structure, a side surface of the groove may be inclined as illustrated in FIG. 3. However, as illustrated in FIG. 6 or the like, the side surface of the groove may not be inclined, and the degree of inclination (or non-inclination) may be determined according to a removal method of the first conductive semiconductor layer 102, the active layer 103, and the second conductive semiconductor layer 104.

The first internal electrode 105a and the second internal electrode 105b may be formed of a conductive material that exhibits ohmic-characteristics. The first internal electrode 105a and the second internal electrode 105b may respectively be formed with regard to the first and second conductive semiconductor layers 102 and 104, and have a single layer structure or a multilayer structure. For example, the first and second internal electrodes 105a and 105b may be formed of one of silver (Ag), aluminum (Al), nickel (Ni), chromium (Cr), palladium (Pd), copper (Cu), and the like, or an alloy thereof using a deposition method, a sputtering method, a plating method or the like. The first and second internal electrodes 105a and 105b may be formed of a high reflectance material, such that the semiconductor light emitting device 100 may be suitable to be used in the form of a flip-chip as described above. However, forming the first and second internal electrodes 105a and 105b with a reflective material is not necessarily required and a portion or the entirety of the first and second internal electrodes 105a and 105b may be formed of a transparent conductive oxide (TCO) or the like, as necessary.

In one embodiment, the first internal electrode 105a may include a plurality of contact regions C that each have a width relatively larger than other regions of the first internal electrode 105a when viewed from the above, as can be seen in FIG. 1, thereby securing sufficient contact areas with the first pad electrode 107a. The contact regions C may be formed such that they penetrate through the second conductive semiconductor layer 104 and the active layer 103 such that the first internal electrode 105a is connected to the first conductive semiconductor layer 102 in the contact regions C. In particular, the plurality of contact regions C may be arranged in rows and columns as shown in FIG. 1, such that current flow may be uniform therein. In addition, the plurality of contact regions C may be connected to each other by other regions of the first internal electrode 105a (e.g., such as the regions indicated in dashed lines in FIG. 1 and indicating regions in which first internal electrode 105a extends, and such as the row of four contact regions C that are interconnected by the first internal electrode 105a as shown in FIG. 2). The second internal electrode 105b may be formed in a region separate from and spaced away from a circumferential portion of the contact regions C, such that stress in the circumferential portion of the contact regions C may be decreased, to reduce the frequency of occurrence of a delamination phenomenon of the second internal electrode 105b. Further, if a portion connecting the contact regions C is not present, the entirety of the contact regions C may be surrounded by the second internal electrode 105b, and in this case, a large amount of stress may act on the circumferential portion of the contact regions C and thereby increase a probability that the second internal electrode 105b and the second conductive semiconductor layer 104 will become delaminated. Meanwhile, it is not necessarily required in the embodiment, but the first internal electrode 105a may include a linear or other region connecting contact regions C in different rows among the plurality of contact regions C, as illustrated in dashed lines in FIG. 1, and the linear or other region may be positioned in the perimeter of the semiconductor light emitting device (as further illustrated in FIG. 1).

The first internal electrode 105a may be surrounded by an insulating part 106 and electrically isolated from the active layer 103 and the second conductive semiconductor layer 104. In addition, as illustrated in FIG. 2, the insulating part 106 may allow selected ones of the plurality of contact regions C (and corresponding portion(s) of the first internal electrode 105a) to be exposed and connected to the first pad electrode 107a, while allowing the remainder of the first internal electrode 105a (that is, regions connecting the plurality of contact regions C) not to be exposed and to instead be covered by the insulating part 106. In this manner, the plurality of contact regions C having an increase width may be connected to the first pad electrode 107a, while other regions of the first internal electrode 105a (e.g., regions connecting the plurality of contact regions C and including regions that have a reduced width) may not be in direct contact to or connection with the first pad electrode 107a. The presence of the other regions may ensure that the semiconductor light emitting device provides a sufficient light emitting area and reduces light loss due to light absorption of the first internal electrode 105a.

Specifically, in order to connect the first pad electrode 107a and the first internal electrode 105a, a process of forming an open region in the insulating part 106 can be used. However, there may be a limitation in reducing the width of the contact regions C in consideration of a process margin. As the area of regions of the first internal electrode 105a that are exposed through the open region of the insulating part 106 increases, the area of the first internal electrode 105a may also increase, thereby reducing the light emitting area and light extracting efficiency of the semiconductor light emitting device. Thus, in one embodiment, only the contact regions C connected to the first pad electrodes 107a are formed to have a relatively large width, thereby improving light emitting efficiency. Meanwhile, with regard to the regions of the first internal electrode 105a that are formed through the same process, the contact regions C and other regions of the first internal electrode 105a may have the same thickness, and as described later, the contact regions C may denote a portion filling a first region of the groove and the other regions may denote a portion filling a second region of the groove. However, it is not necessarily limited thereto.

The insulating part 106 may fill a portion of the groove, such that the first internal electrode 105a is not connected to the active layer 103 and to the second conductive semiconductor layer 104. In addition, the insulating part 106 may be formed on and between the first and second internal electrodes 105a and 105b to isolate the first and second internal electrodes 105a and 105b from each other. In this case, the insulating part 106 may have an open region in order to expose at least one portion of each of the first and second internal electrodes 105a and 105b, and the first and second pad electrodes 107a and 107b may be formed on/in the open region. The insulating part 106 may be formed of any material that has electrically insulating characteristics, for example an electrical insulating material such as a silicon oxide, a silicon nitride, or the like. In addition, light reflecting fillers are dispersed in the electrically insulating material to form a light reflecting structure.

The first and second pad electrodes 107a and 107b may be connected to the first and second internal electrodes 105a and 105b, respectively, and may serve as external terminals of the semiconductor light emitting device 100. The first and second pad electrodes 107a and 107b may be formed as a single layer or two or more layers and formed of one of Ag, Al, Ni, Cr, Pd, Cu and the like, or an alloy thereof using a deposition method, a sputtering method, a plating method or the like. In addition or alternatively, the first and second pad electrodes 107a and 107b may be formed of or include a eutectic metal such as AuSn, SnBi or the like. In such a case, when mounted in a package or the like, the first and second pad electrodes 107a and 107b may be bonded by eutectic bonding, so there is no need to use a solder bump generally required in a flip chip bonding process. As compared to cases using the solder bump, the mounting process using the eutectic metal may allow for superior heat dissipation. In this case, in order to obtain superior heat dissipation, the first and second pad electrodes 107a and 107b may be formed to occupy a relatively large area. Specifically, the area occupied by the first and second pad electrodes 107a and 107b may be 80% to 95% with respect to an overall area of an upper surface of the semiconductor light emitting device.

Figure 4:
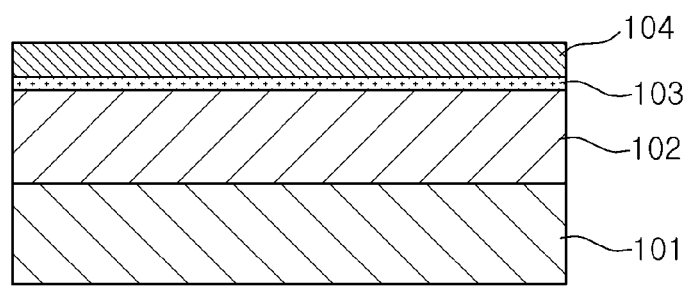
FIGS. 4 through 15 are schematic process views illustrating steps of a method of manufacturing a semiconductor light emitting device according to an embodiment of the present disclosure.

The structure of the semiconductor light emitting device may be more specifically understood from the description of a manufacturing method thereof described below. FIGS. 4 through 15 are schematic process views illustrating steps of a method of manufacturing a semiconductor light emitting device according to an embodiment of the present disclosure. In the method of manufacturing a semiconductor light emitting device according to the embodiment, a semiconductor stack may first be formed by growing the first conductive semiconductor layer 102, the active layer 103 and the second conductive semiconductor layer 104 on the substrate 101 using a process such as MOCVD, HVPE or the like, as shown in FIG. 4. The substrate 101 may have uneven structures formed on an upper surface thereof (i.e., a surface contacting the first conductive semiconductor layer 102), as shown in the examples of FIGS. 2 and 3, or the substrate may not have uneven structures on an upper surface thereof, as shown in the example of FIG. 4.

Figure 5:
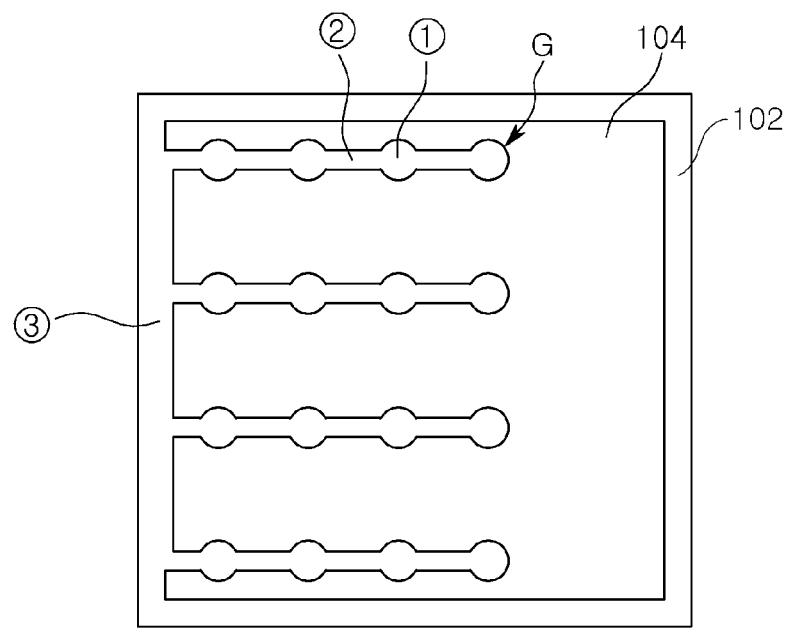

After the semiconductor stack is formed, as illustrated in FIG. 5 (a planar view) and FIG. 6 (a cross-sectional view), a groove G exposing the first conductive semiconductor layer 102 is formed by removing a portion of the first conductive semiconductor layer 102, the active layer 103, and the second conductive semiconductor layer 104. The layers may be removed by etching such that side surfaces of the groove are not inclined, as shown in FIG. 6. Alternatively, other removal methods can be used which may provide a groove with inclined edges such as those shown in FIGS. 2 and 3. Meanwhile, as illustrated in FIG. 5, the layers can be removed in an edge region of the light emitting structure simultaneously with or separately from the forming of the groove G to expose an edge region of the first conductive semiconductor layer 102. The exposed edge region of the first conductive semiconductor layer 102 may be used as a scribing line at the time of separating the light emitting structure into chip units. However, the forming of the scribing line is not necessary or required in the embodiment, and as needed, other regions exposing the first conductive semiconductor layer 102 except for the groove G may or may not be formed.

In one embodiment, the groove G may be provided as a region for forming the internal electrode 105a therein and may include a plurality of first regions ① having a relatively large width to expose a greater area of the first conductive semiconductor layer 102 and second regions ② connecting at least some of the first regions ① and having a relatively small width. The internal electrode 105a may be formed in the groove G to have a shape corresponding to the groove G. In general, the shape of the respective first regions ① is not limited to having a circular shape when viewed from above, and other shapes such as a polygonal shape, oval shape or the like may be used.

As illustrated in FIG. 5, the plurality of first regions ① may be arranged in rows and columns, and the second regions ② may connect first regions ① located in a same row among the plurality of first regions ①. In addition, the groove G may further include a third region ③ connecting first regions ① located in different rows among the plurality of first regions ①. Accordingly, a single groove G may be used to connect all of the first regions ①, and the first internal electrode 105a having a shape corresponding to the groove G may be connected in a similar manner.

Figure 7:
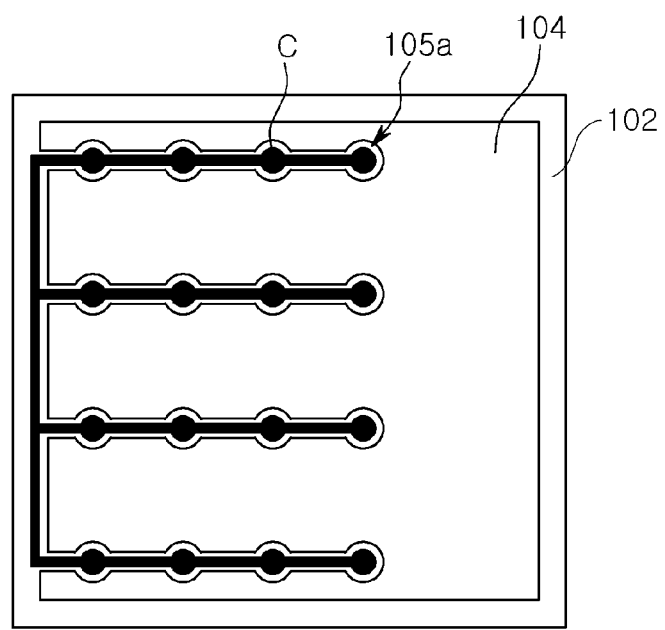
Figure 8:
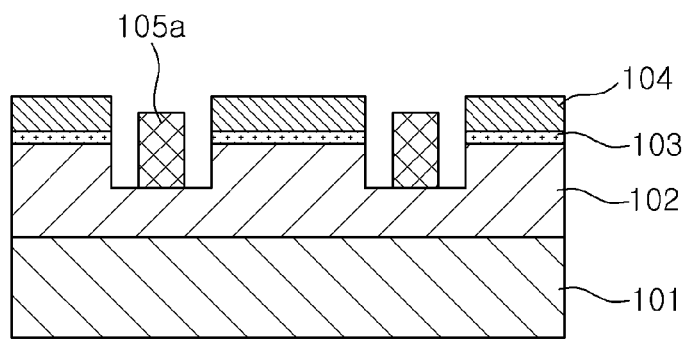
Figure 9:
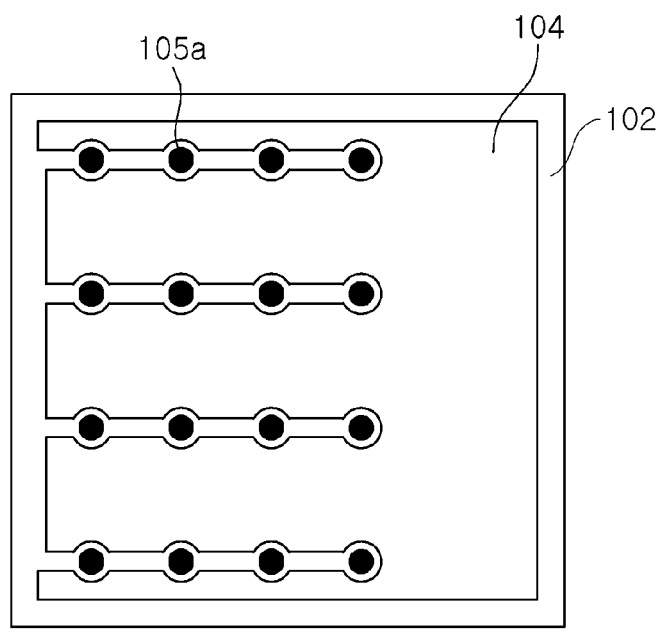

Next, as illustrated in FIG. 7 (a planar view) and FIG. 8 (a cross-sectional view), the first internal electrode 105a contacting and connected to the first conductive semiconductor layer 102 may be formed in such a manner as to correspond to the shape of the groove G. Accordingly, the plurality of contact regions C of the first internal electrode 105a may be formed in the plurality of first regions ① of the groove G and regions of the first internal electrode 105a formed in the second regions ② and the third region ③ may connect the plurality of contact regions C. However in some examples, as illustrated in FIG. 9, the first internal electrode 105a may be formed of a plurality of electrodes separate from each other, such that the first internal electrode 105a is formed in each of the contact regions C only and may not be formed in the second regions ② and the third region ③. The case in which first internal electrode 105a is only formed in the contact regions C may be disadvantageous in terms of a current distribution as compared to the former case in which the first internal electrode 105a is formed in the first regions ①, the second regions ②, and the third region ③; however, light loss due to the first internal electrode 105a may be reduced. In addition, the separation of the second internal electrode 105b due to the groove G may be allowed, such that the delamination phenomenon of the second internal electrode 105b may be alleviated.

Figure 10:
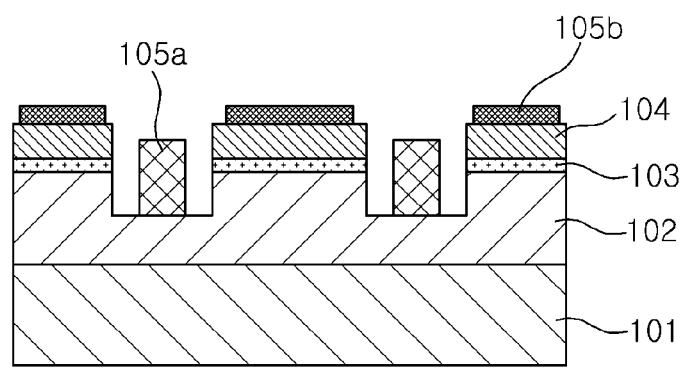
Figure 11:
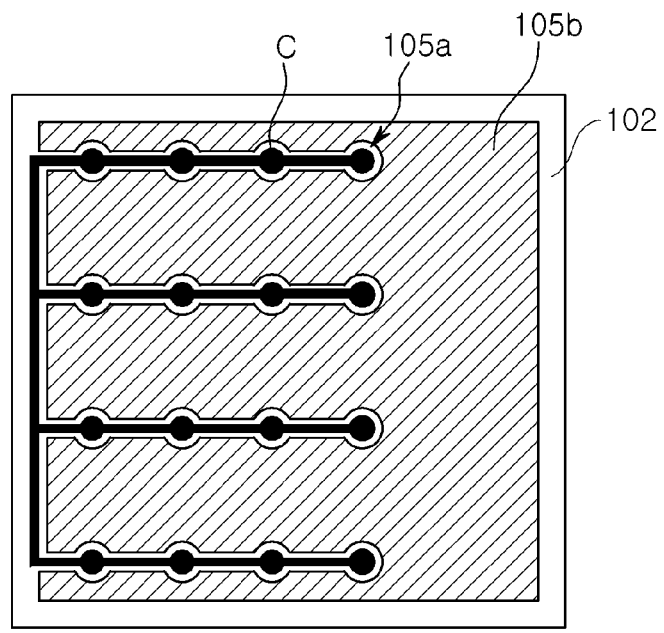
Figure 12:
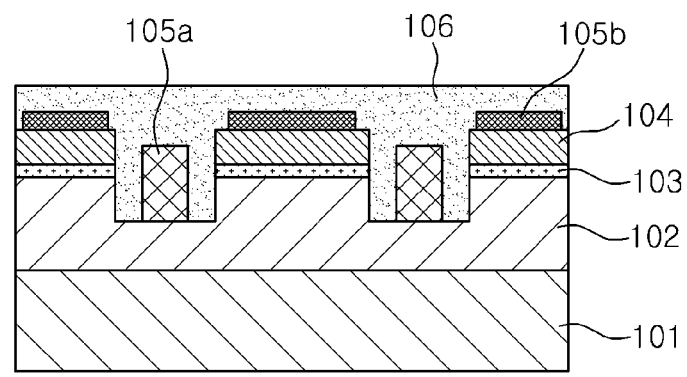
Figure 13:
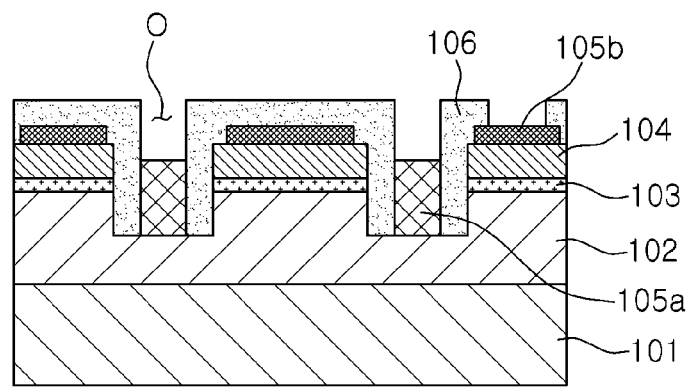
Figure 14:
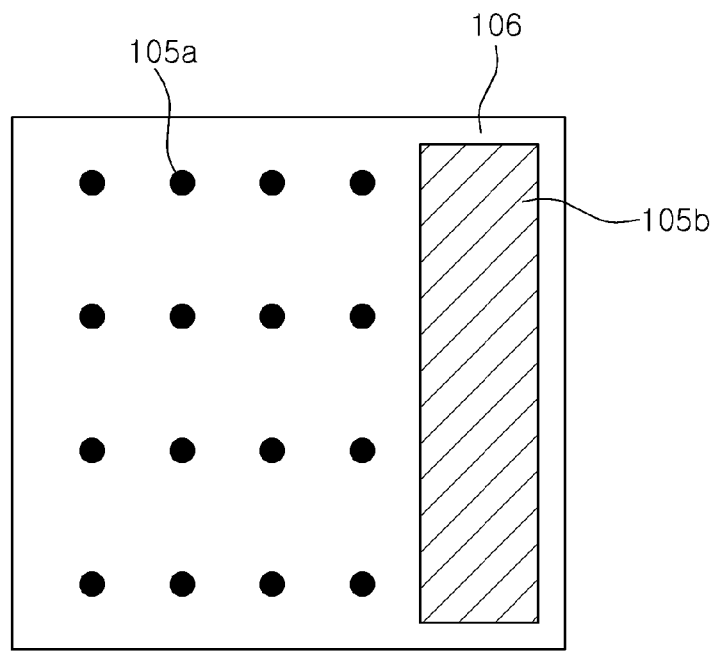
Figure 15:
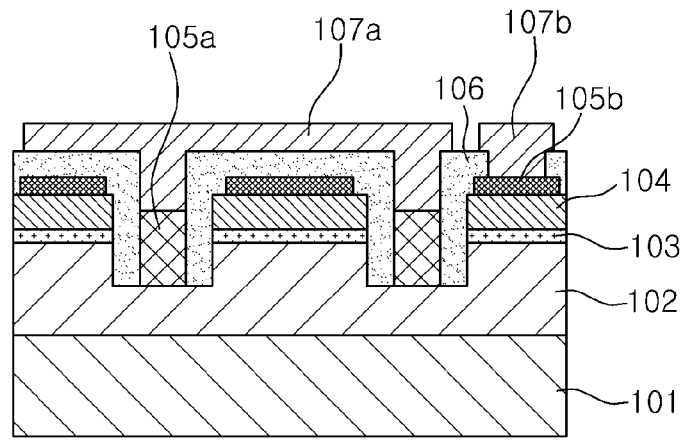

As illustrated in FIG. 10 (a cross-sectional view) and FIG. 11 (a planar view), the second internal electrode 105b is formed on the second conductive semiconductor layer 104, and thereafter, the insulating part 106 may be formed to cover the groove G and the first and second internal electrodes 105a and 105b (as shown in FIG. 12). The insulating part 106 may be formed to cover the entirety of the upper surface of the semiconductor light emitting device and may be formed of an insulating material such as silicon oxide, silicon nitride or the like by using a deposition method, a spin coating method or the like. Thereafter, as illustrated in FIG. 13 (a planar view) and FIG. 14 (a cross-sectional view), an open region O may be formed in the insulating part 106 to expose at least one portion of the first and second internal electrodes 105a and 105b. In this case, as described above, the first internal electrode 105a may have exposed portions corresponding to the contact regions C. Then, as illustrated in FIG. 15, the first and second pad electrodes 107a and 107b are formed to be connected to the first and second internal electrodes 105a and 105b, respectively.

The semiconductor light emitting device having the above-described structure may be mounted on a mounting substrate or the like, to thereby be used in a light emitting apparatus, for example a backlight unit of a display device, an indoor/outdoor illumination device, a vehicle headlight, or the like.

Figure 16:
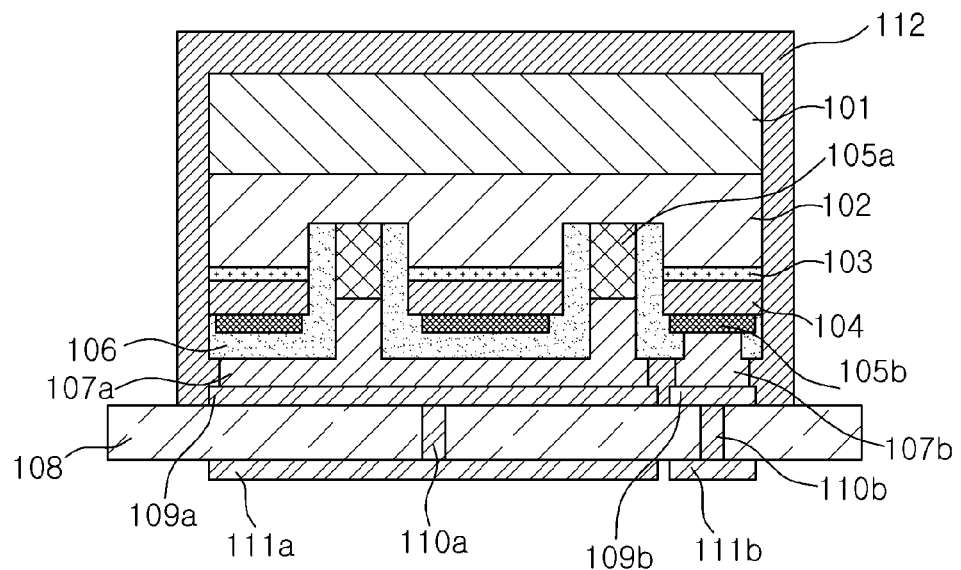
FIGS. 16, 17, and 18 are schematic cross-sectional views illustrating a light emitting apparatus according to an embodiment of the present disclosure.
Figure 17:
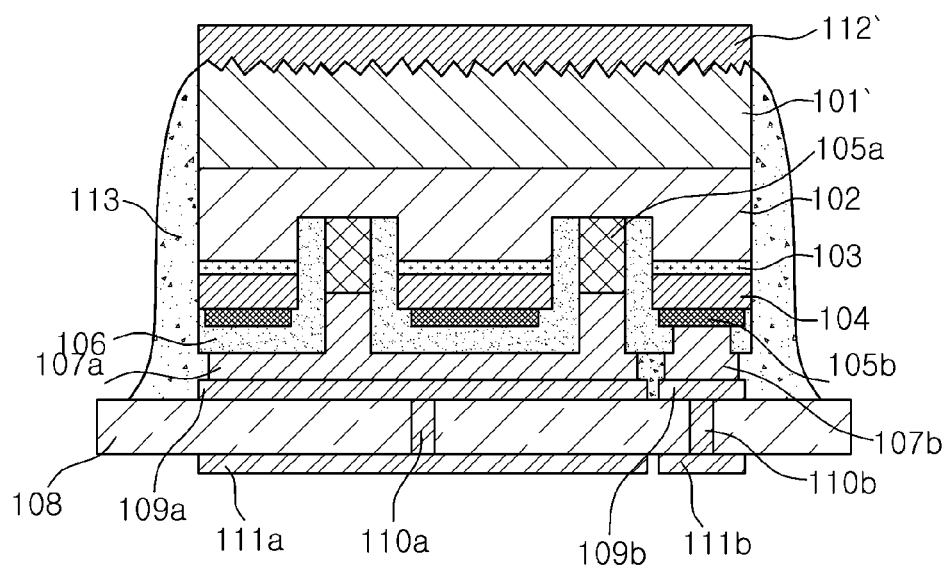
Figure 18:
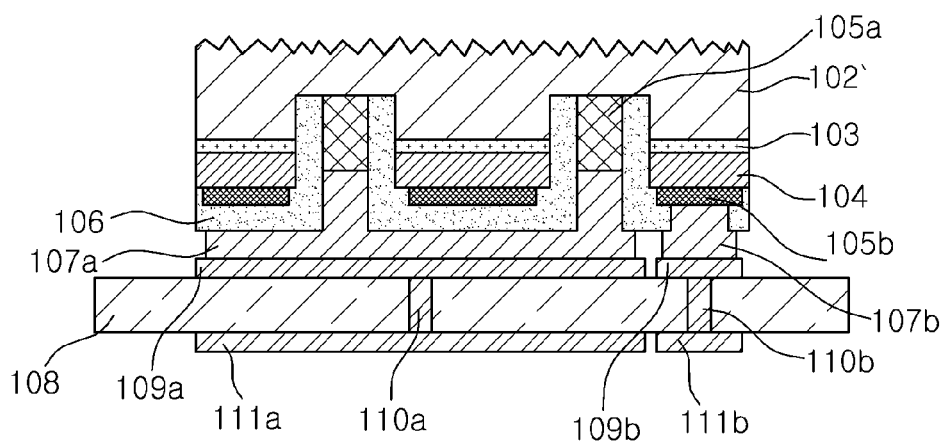

Specifically, FIGS. 16, 17, and 18 are schematic cross-sectional views illustrating a light emitting apparatus according to an embodiment of the present disclosure. The light emitting apparatus according to the embodiment of the present disclosure may include a mounting substrate 108 and a semiconductor light emitting device mounted thereon, and in this case, the semiconductor light emitting device may a structure such as that described above in relation to FIGS. 1-15. The mounting substrate 108 may include first and second upper surface electrodes 109a and 109b and first and second lower surface electrodes 111a and 111b. As illustrated, the first and second upper surface electrodes 109a and 109b may be connected to the first and second lower surface electrodes 111a and 111b via first and second through holes 110a and 110b. The illustrated structure of the mounting substrate 108 is provided by way of example, and may be used in various forms. In addition, the mounting substrate 108 may be provided as a circuit substrate such as PCB, MCPCB, MPCB, FPCB or the like, or as a ceramic substrate such as AlN, $Al_2O_3$ or the like. Alternately, the mounting substrate 108 may be provided in the form of a package lead frame, rather than having the form of a substrate.

The semiconductor light emitting device may be provided in the form of a flip-chip as described above. In other words, the first and second pad electrodes 107a and 107b may be disposed in a direction toward the mounting substrate 108. The first and second pad electrodes 107a and 107b may include bonding layers, for example, eutectic metal layers on surfaces thereof, such that the first and second pad electrodes 107a and 107b may be bonded to the first and second upper surface electrodes 109a and 109b. In situations in which the first and second pad electrodes 107a and 107b do not include bonding layers, separate bonding layers such as eutectic metal layers, conductive epoxy layers, or the like may be formed between the first and second pad electrodes 107a and 107b and the first and second upper surface electrodes 109a and 109b. Meanwhile, it may not necessarily be required in the embodiment, but a wavelength converting part 112 for converting a wavelength of light emitted from the semiconductor light emitting device into another wavelength may be formed or disposed on surfaces of the semiconductor light emitting device. To this end, the wavelength converting part 112 may include a fluorescent substance, a quantum dot, or the like.

In a modified example of a light emitting apparatus shown in FIG. 17, a wavelength converting part 112' may be formed on the upper surface of the semiconductor light emitting device. In particular, the wavelength converting part 112' may be formed only on an upper surface of a substrate 101', and a reflecting part 113 may be formed on side surfaces of the semiconductor light emitting device. In this case, an uneven structure may be formed between the wavelength converting part 112' and the substrate 101', and such uneven structure may be applied to any of the foregoing embodiments. The reflecting part 113 may have a structure in which reflecting fillers, for example, ceramics or metals such as $TiO_2$, $SiO_2$ and the like are dispersed within a translucent resin. In addition, as in the example of a light emitting apparatus in FIG. 18, the substrate 101' may be removed from the semiconductor light emitting device and unevenness may be formed on a surface of a first conductive semiconductor layer 102' (e.g., a surface opposite to the surface having the activate layer 103 and first and second internal electrodes 105a and 105b formed thereon). Either or both of the wavelength converting part and the reflecting part described in the foregoing embodiment may be incorporated into the light emitting apparatus of FIG. 18.

Figure 19:
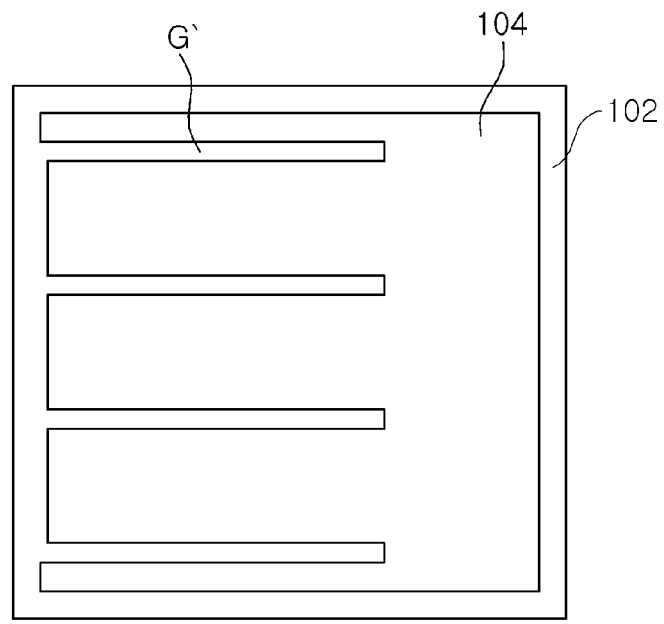
FIGS. 19 through 23 are schematic views illustrating a semiconductor light emitting device according to other embodiments of the present disclosure and process views illustrating steps of a method of manufacturing the same.

Referring to FIGS. 19 through 23, a semiconductor light emitting device according to other embodiments of the present disclosure and a method of manufacturing the same are provided. First, as can be seen in FIG. 19, a shape of a groove G' exposing the first conductive semiconductor layer 102 in the embodiment is different from the case of the foregoing embodiments. Specifically, the groove G' may have a shape in which a plurality of stripes are arranged in parallel to each other, when viewed from the above. In this case, the groove G' may include a region formed in a direction perpendicular to the plurality of stripes and connecting the plurality of stripes, in a similar manner to the third region ③ of the foregoing embodiment. The plurality of stripes may have a substantially uniform width, and the first internal electrode 105a may have a shape corresponding thereto. Accordingly, the first internal electrode 105a may not include contact regions having a relatively large width, and consequently the first internal electrode 105a have a uniform width to reduce an overall size of the first internal electrode 105a, thereby allowing for an increase in light emitting area and a reduction in light loss.

Figure 20:
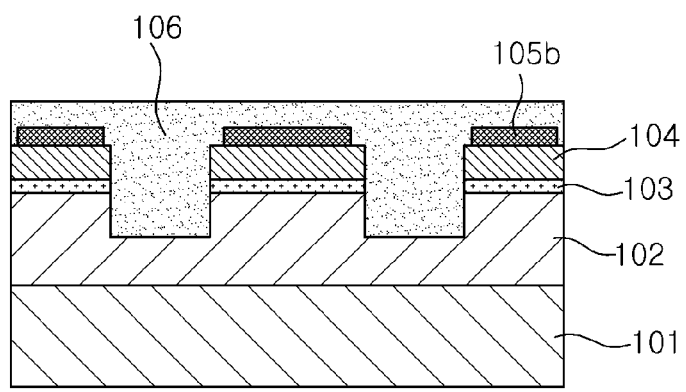
Figure 21:
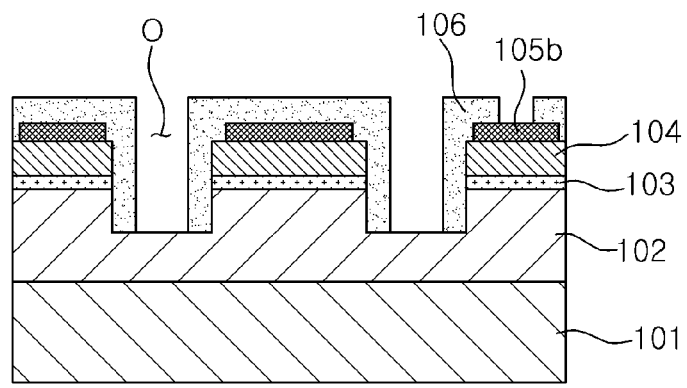
Figure 22:
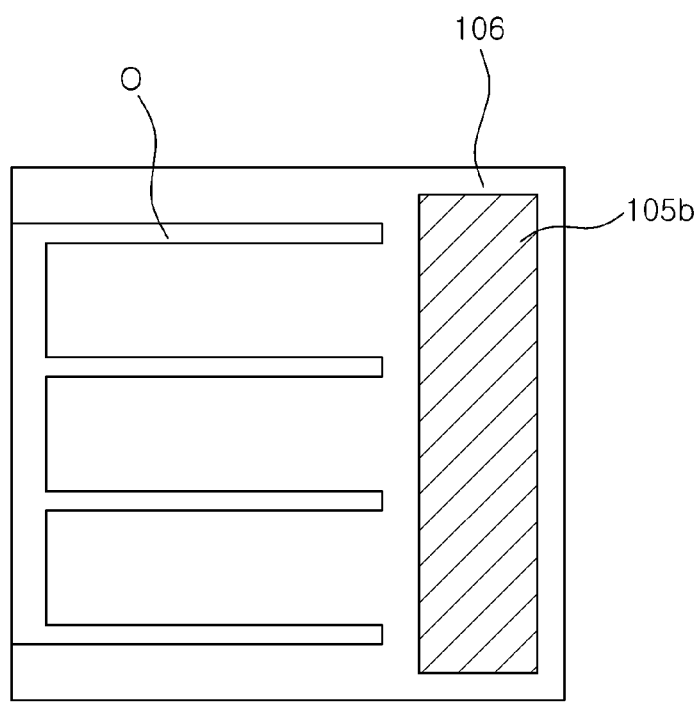
Figure 23:
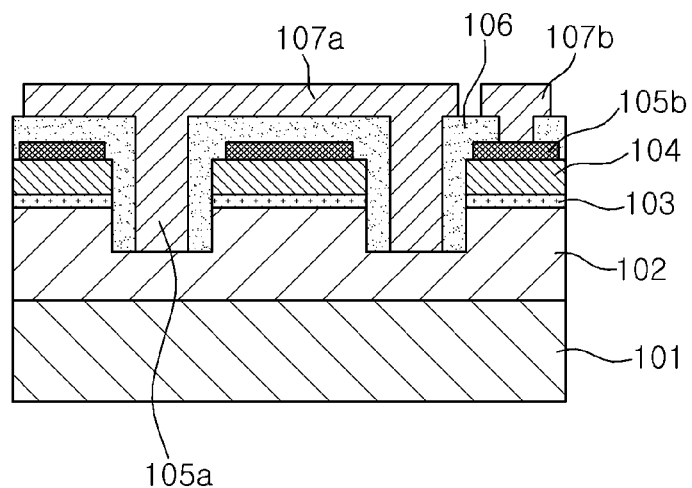

Next, as illustrated in FIG. 20, the insulating part 106 may be entirely formed above the groove G' and the light emitting structure. Unlike in the foregoing embodiments, the insulating part 106 may be formed before the forming of the first internal electrode 105a in the embodiment. Subsequently, as illustrated in FIG. 21 (a cross-sectional view) and FIG. 22 (a planar view), a portion of the insulating part 106 is removed to form the open region O, such that the first conductive semiconductor layer 102 and the second internal electrode 105b may be exposed through the open regions. Then, as illustrated in FIG. 23, the first internal electrode 105a, and the first pad electrode 107a and the second pad electrode 107b are formed. The first internal electrode 105a, and the first pad electrode 107a and the second pad electrode 107b can be formed through a single process. Alternatively, the electrodes may be formed through separate processes. In this case, since masks for the respective first internal electrode 105a, and the first pad electrode 107a and the second pad electrode 107b may not be required in the embodiment, process efficiency may be improved as compared to the case of the foregoing embodiments. Meanwhile, the first internal electrode 105a, and the first pad electrode 107a and the second pad electrode 107b may be formed of the same material or may be formed of different materials as needed.

As in the embodiment, the first internal electrode 105a is formed after the forming of the open region in the insulating part 106, such that an upper surface of the first internal electrode 105a may not be covered by the insulating part 106. Accordingly, the first internal electrode 105a and the first pad electrode 107a may contact each other over the entire region thereof, such that a smooth current injection may be facilitated and the contact regions having a relatively large width as described in the foregoing embodiment may not be required. As described above, in the case in which the first internal electrode 105a is first formed and the open region is then formed in the insulating part 106, there is a limitation in reducing a width of the first internal electrode 105a in the vicinity of the open region due to a process margin. In contrast, in the case of FIGS. 19-23, since the open region is formed in the insulating part 106 before the forming of the first internal electrode 105a in the embodiment, the width of the first internal electrode 105a may not be affected thereby and accordingly, the first internal electrode 105a may have a relatively small width. In addition, the second internal electrode 105b may not surround the entire region of the first internal electrode 105a to alleviate the delamination phenomenon of the second internal electrode 105b.

Figure 24:
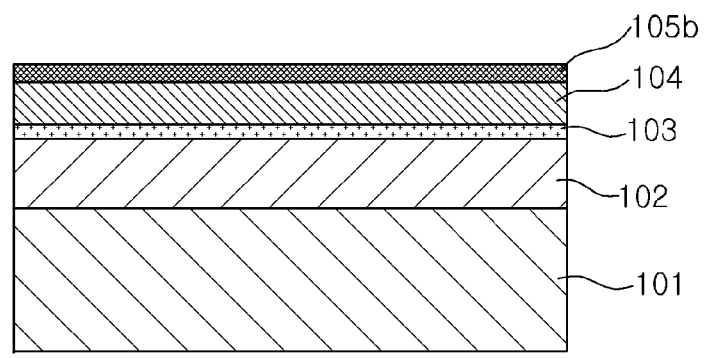
FIGS. 24 and 25 are schematic process cross-sectional views illustrating steps of a method of manufacturing a semiconductor light emitting device according to other embodiment(s) of the present disclosure.
Figure 25:
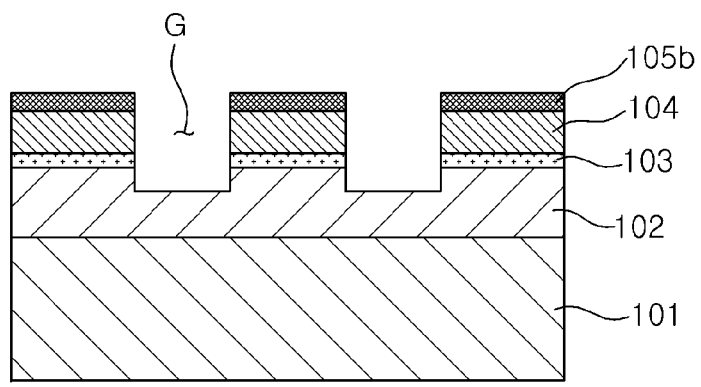

FIGS. 24 and 25 are schematic process cross-sectional views illustrating steps of a method of manufacturing a semiconductor light emitting device according to a further embodiment of the present disclosure. In the embodiment, as illustrated in FIG. 24, the first conducive semiconductor layer 102, the active layer 103, the second conductive semiconductor layer 104, and the second internal electrode 105b are sequentially formed on the substrate 101. Thereafter, as illustrated in FIG. 25, a portion of each of the first conducive semiconductor layer 102, the active layer 103, the second conductive semiconductor layer 104, and the second internal electrode 105b is removed to form a groove G, and it is not necessary to prepare a mask for forming the second internal electrode 105b to thereby improve process efficiency. After the forming of the groove G, the processes performed in the foregoing embodiments may be used. In other words, the forming of the groove G in the first internal electrode, the forming of the insulating part, the forming of the open region in the insulating part, and the forming of the first and second pad electrodes are performed in sequence. Alternatively, the forming of the insulating part, the forming of the open region in the insulating part, the forming of the first internal electrode, and the forming of the first and second pad electrodes are performed in sequence.

As set forth above, according to embodiments of the disclosure, a semiconductor light emitting device having improved current distribution efficiency as well as having a significantly reduced delamination defect between an electrode and a semiconductor layer can be provided.

In addition, a semiconductor light emitting device having a reduced operating voltage and improved light outputs can be provided.

In addition, a light emitting apparatus having enhanced heat radiation efficiency and reliability can be provided.

The beneficial effects obtainable from the present disclosure are not limited thereto, and even if they are or are not explicitly mentioned, further objects and effects derived from embodiments of the present disclosure are envisioned.

While the present disclosure has been shown and described in connection with certain illustrative embodiments, it will be apparent to those skilled in the art that modifications and variations can be made without departing from the spirit and scope of the disclosure as defined by the appended claims.

What is claimed is:

1. A semiconductor light emitting device, comprising:
a first conductive semiconductor layer having a first portion and a second portion separated from the first portion;
an active layer disposed on the first portion of the first conductive semiconductor layer; and
a second conductive semiconductor layer disposed on the active layer,
wherein the second portion has a plurality of stripe shape regions, each of which includes a plurality of first regions and a plurality of second regions connecting the plurality of first regions, and each of the first regions has a width that is larger than a width of each of the second regions,
wherein the semiconductor light emitting device further comprises:
a first internal electrode including a plurality of contact regions, each disposed on a corresponding first region;
a second internal electrode disposed on substantially an entire surface of the second conductive semiconductor layer to enclose the first and the second regions, and connected to the second conductive semiconductor layer;
an insulating part disposed on one portion of the second portion, the first and second internal electrodes respectively and having an open region to expose the plurality of contact regions of the first internal electrode and at least one portion of the second internal electrode; and
first and second pad electrodes disposed on the insulating part and each connected to a respective one of the first and second internal electrodes exposed through the open region.

2. The semiconductor light emitting device of claim 1, wherein:
the first internal electrode further includes a plurality of electrode parts connecting the plurality of contact regions, each disposed on a corresponding second region, and the insulating part is formed to cover the plurality of electrode parts.

3. The semiconductor light emitting device of claim 2, wherein the first pad electrode is disposed on the insulating part to interconnect the plurality of contact regions of the first internal electrode.

4. The semiconductor light emitting device of claim 1, wherein the plurality of stripe shape regions are arranged in substantially parallel to each other.

5. The semiconductor light emitting device of claim 4, wherein the plurality of first regions are arranged in a plurality of rows and a plurality of columns, and each of the second regions connects first regions that are arranged in a same row.

6. The semiconductor light emitting device of claim 5, wherein the first internal electrode includes an interconnecting electrode part disposed on a third region connecting first regions in different rows among the plurality of rows.

7. The semiconductor light emitting device of claim 6, wherein the first internal electrode is formed to a same thickness in the first regions and in the second regions thereof.

8. The semiconductor light emitting device of claim 1, wherein the first pad electrode is disposed on one area of the insulating part to cover the plurality of first regions and the plurality of second regions; and the second pad electrodes are disposed on the other area of the insulating part.

9. The semiconductor light emitting device of claim 1, wherein the first internal electrode and the first pad electrode are formed of the same material.

10. A light emitting apparatus, comprising:
   a mounting substrate; and
   a semiconductor light emitting device disposed on the mounting substrate and configured to emit light when an electrical signal is applied thereto,
   wherein the semiconductor light emitting device includes:
      a first conductive semiconductor layer having a first portion and a second portion separated from the first portion;
      an active layer disposed on the first portion of the first conductive semiconductor layer; and
      a second conductive semiconductor layer disposed on the active layer,
      wherein the second portion has a plurality of stripe shape regions, each of which includes a plurality of first regions and a plurality of second regions connecting the plurality of first regions, and each of the first regions has a width that is larger than a width of each of the second regions,
   wherein the semiconductor light emitting device further comprises:
      a first internal electrode including a plurality of contact regions, each disposed on a corresponding first region;
   a second internal electrode disposed on substantially an entire surface of the second conductive semiconductor layer to enclose the first and the second regions and connected to the second conductive semiconductor layer;
   an insulating part disposed on one portion of the second portion, the first and second internal electrodes respectively and having an open region to expose the plurality of contact regions of the first internal electrode and at least one portion of the second internal electrode; and
   first and second pad electrodes disposed on the insulating part and each connected to a respective one of the first and second internal electrodes exposed through the open region.

* * * * *